(12) United States Patent
Park et al.

(10) Patent No.: US 7,704,646 B2
(45) Date of Patent: Apr. 27, 2010

(54) HALF TONE MASK AND METHOD FOR FABRICATING THE SAME

(75) Inventors: Sang-Uk Park, Gumi (KR); Kap-Seok Kang, Gumi (KR); Keun-Sik Lee, Gumi (KR); Jae-Woo Park, Gumi (KR); Yu-Kyung Sim, Gumi (KR)

(73) Assignee: LG Innotek Co., Ltd., Seoul (KR)

( * ) Notice: Subject to any disclaimer, the term of this patent is extended or adjusted under 35 U.S.C. 154(b) by 959 days.

(21) Appl. No.: 11/268,032

(22) Filed: Nov. 7, 2005

(65) Prior Publication Data

US 2006/0099521 A1 May 11, 2006

(30) Foreign Application Priority Data

Nov. 8, 2004 (KR) .................... 10-2004-0090273
Oct. 21, 2005 (KR) .................... 10-2005-0099477

(51) Int. Cl.
*G03F 1/08* (2006.01)
*G03F 1/14* (2006.01)

(52) U.S. Cl. .......................... 430/5; 216/12

(58) Field of Classification Search .............. 430/5; 216/12
See application file for complete search history.

(56) References Cited

U.S. PATENT DOCUMENTS

| | | | | |
|---|---|---|---|---|
| 4,293,624 A | * | 10/1981 | Buckley ............... | 430/5 |
| 5,538,816 A | * | 7/1996 | Hashimoto et al. ...... | 430/5 |
| 5,604,060 A | * | 2/1997 | Miyashita et al. ...... | 430/5 |
| 5,618,643 A | * | 4/1997 | Dao et al. ............. | 430/5 |
| 5,620,817 A | * | 4/1997 | Hsu et al. ............. | 430/5 |
| 5,786,114 A | * | 7/1998 | Hashimoto ............. | 430/5 |
| 2002/0037625 A1 | * | 3/2002 | Kyoh et al. ........... | 430/5 |
| 2003/0118920 A1 | * | 6/2003 | Johnstone et al. ...... | 430/5 |
| 2003/0138707 A1 | * | 7/2003 | Dieu et al. ........... | 430/5 |

FOREIGN PATENT DOCUMENTS

| | | |
|---|---|---|
| JP | 1995-199689 | 8/1995 |
| JP | 1996-167670 | 6/1996 |
| JP | 1997-169143 | 6/1997 |
| JP | 2003-111318 | 4/2003 |

(Continued)

OTHER PUBLICATIONS

Office Action dated Dec. 7, 2007 for Korean Patent Application No. 10/2005-0099477, 3 pages.

(Continued)

*Primary Examiner*—Stephen Rosasco
*Assistant Examiner*—John Ruggles
(74) *Attorney, Agent, or Firm*—Ladas & Parry LLP (57) ABSTRACT

A half tone mask having a transparent substrate, a light semi-transmission layer, and a light shield layer; and a method for fabricating the same. The halftone mask is applied to multiple cycles of a photolithography process, thus shortening a time taken to fabricate the mask and reducing the production costs of the mask. Since a desired pattern is uniformly formed through a light semitransmission layer of the half tone mask of the present invention according to the uniformity of a chrome oxide ($Cr_xO_y$) film, i.e., the uniformity in sputtering, the halftone mask is not limited in size.

5 Claims, 9 Drawing Sheets

FOREIGN PATENT DOCUMENTS

| | | |
|---|---|---|
| JP | 2003-179613 | 6/2003 |
| JP | 2003-339441 | 9/2003 |
| JP | 2003-341023 | 9/2003 |
| JP | 2004-170552 | 12/2004 |
| JP | 2005-231468 | 10/2005 |
| JP | 2005-360526 | 12/2005 |
| KR | 1994-024764 | 9/1994 |
| KR | 1995-0002915 | 2/1995 |
| KR | 1019950004966 B1 | 5/1995 |
| KR | 1996-0011063 | 4/1996 |
| KR | 2000-0036486 | 6/2000 |
| KR | 1999-0036342 | 3/2005 |
| KR | 2005-0019701 | 3/2005 |

OTHER PUBLICATIONS

English translation of Office Action dated Dec. 7, 2007 for Korean Patent Application No. 10/2005-0099477, 3 pages.
Office Action dated May 13, 2007 for Korean Patent Application No. 10/2005-0099477, 7 pages.
English translation of Office Action dated May 13, 2007 for Korean Patent Application No. 10/2005-0099477, 8 pages.

\* cited by examiner

FIG.1

PRIOR ART

HALF TONE MASK AND METHOD FOR FABRICATING THE SAME

CROSS REFERENCE TO RELATED APPLICATIONS

The present application claims priority to Korean Patent Application No. 10-2004-0090273 filed on Nov. 8, 2004 and Korean Patent Application No. 10-2005-0099477 filed on Oct. 21, 2005, both of which are incorporated herein by reference.

BACKGROUND OF THE INVENTION

1. Field of the Invention

The present invention relates to a half tone mask having a transparent substrate, a light semitransmission layer and a light shield layer, a method for fabricating the same, and a flat panel display using the same.

2. Description of the Related Art

Figure 1:
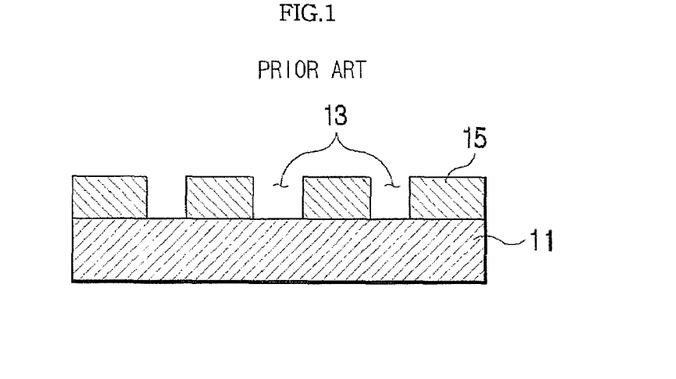
FIG. 1 is a sectional view of a conventional photo mask.

A photo mask, which is generally used in patterning using a photolithography process, as shown in FIG. 1, comprises a transparent substrate 11, light transmission portions 13 formed on the transparent substrate 11 for completely transmitting light, and light shield portions 15 formed on the transparent substrate 11 for completely shielding light.

The above conventional mask forms only one pattern layer, thus being used only in one cycle of the photolithography process including exposure, development, and etching. More specifically, in a Thin Film Transistor (TFT) and a Color Filter (CF) of a liquid crystal display, many layers are deposited/applied, and the deposited/applied layers are respectively patterned by the photolithography process. The reduction of only one cycle of the photolithography process results in economic advantages. However, the conventional mask forms only one pattern layer, thus being noneconomical.

In order to solve the above problem, a gray tone mask comprising light transmission portions completely transmitting light, a light shield layer completely shielding light, and a slit pattern transmitting a reduced amount of irradiated light has been developed. However, the gray tone mask controls the amount of light transmission using diffraction of light passing through a fine pattern, thus having a limit in the amount of light transmission due to the limit of the slit pattern. Further, when the gray tone mask has a size more than a designated value, it is not possible to achieve the uniform patterning.

SUMMARY OF THE INVENTION

Therefore, the present invention has been made in view of the above problems, and it is an object of the present invention to provide a half tone mask, which is applied to multiple cycles of a photolithography process and achieves uniform patterning without limitation in dimensions of the mask, a method for fabricating the same, and a flat panel display using the same.

In accordance with one aspect of the present invention, the above and other objects can be accomplished by the provision of a half tone mask comprising a transparent substrate; a light shield layer formed on the transparent substrate, and having light transmission portions completely transmitting irradiated light in a designated wavelength range and light shield portions completely shielding the irradiated light in the designated wavelength range; and light semitransmission portions partially transmitting the irradiated light in the designated wavelength range.

In accordance with a further aspect of the present invention, there is provided a flat panel display fabricated using the half tone mask.

In accordance with another aspect of the present invention, there is provided a method for fabricating a half tone mask comprising sequentially forming a light shield layer and a first photoresist on a transparent substrate, and forming light transmission portions for transmitting light and light shield portions for shielding light on the light shield layer by exposure, development, and etching; removing the first photoresist; forming a second photoresist on the light shield portions and the light transmission portions, and exposing and developing the second photoresist so that necessary parts of the light transmission portions are exposed to the outside; forming a light semitransmission layer for partially transmitting irradiated light in a designated wavelength range on the second photoresist and exposed portions of the transparent substrate; and removing the second photoresist and the light semitransmission layer formed on the second photoresist.

In accordance with another aspect of the present invention, there is provided a method for fabricating a half tone mask comprising sequentially forming a light shield layer and a first photoresist on a transparent substrate, and forming light transmission portions for transmitting light and light shield portions for shielding light on the light shield layer by exposure, development, and etching; removing the first photoresist; forming a light semitransmission layer for partially transmitting irradiated light in a designated wavelength range on the light shield portions and the light transmission portions; forming a second photoresist on the light semitransmission layer, and exposing and developing the second photoresist so that necessary portions of the light semitransmission layer are exposed to the outside; etching the exposed portions of the light semitransmission layer, and removing the second photoresist.

In accordance with yet another aspect of the present invention, there is provided a method for fabricating a half tone mask comprising sequentially forming a light shield layer and a first photoresist on a transparent substrate, and forming light transmission portions for transmitting light and light shield portions for shielding light on the light shield layer by exposure, development, and etching; forming a light semitransmission layer for partially transmitting irradiated light in a designated wavelength range on the first photoresist and the light transmission portions; exposing the light shield portions by removing the first photoresist and portions of the light semitransmission layer formed on the first photoresist; forming a second photoresist on the light shield portions and remaining portions of the light semitransmission layer, and exposing and developing the second photoresist so that necessary portions of the light semitransmission layer are exposed to the outside; and etching the exposed portions of the light semitransmission layer, and removing the second photoresist.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 2:
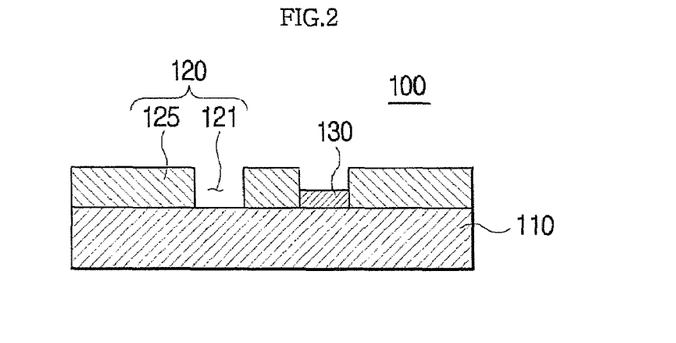
FIG. 2 is a sectional view of a half tone mask in accordance with one embodiment of the present invention.

FIG. 2 is a sectional view of a halftone mask 100 in accordance with one embodiment of the present invention.

As shown in FIG. 2, the half tone mask in accordance with the embodiment of the present invention comprises a transparent substrate 110, a light shield layer 120, and light semitransmission portions 130.

The transparent substrate 110, which completely transmits irradiated light in a designated wavelength range, is made of quartz. The light shield layer 120 is made of chrome (Cr) or chrome oxide ($CrO_2$), and is formed in a designated pattern on the transparent substrate 110. Portions of the transparent substrate 110, at which the pattern of the light shield layer 120 is not formed, serve as light transmission portions 121, and portions of the transparent substrate 110, at which the pattern of the light shield layer 120 is formed, serve as light shield portions 125. The light semitransmission portions 130, which are formed at necessary parts of the light transmission portions 121, are obtained by applying a chrome oxide ($Cr_xO_y$) film to the transparent substrate 110, thereby partially transmitting light in the designated wavelength range.

The light semitransmission portions 130 may be made of various chemical composites so long as the composites can partially transmit irradiated light in a designated wavelength range. In the present invention, the light semitransmission portions 130 are made of one selected from the group consisting of $Cr_xO_y$, $Cr_xCo_y$, $Cr_xCo_yN_z$, $Si_xN_y$, and $Mo_xSi_y$. Most preferably, the light semitransmission portions 130 are made of $Cr_xO_y$. Here, subscripts x, y, and z are natural numbers and denote the numbers of respective chemical elements.

The wavelength range of the irradiated light is varied according to an exposure system, thus being not restricted. Generally, light in a wavelength range of 300 nm~400 nm is used. The light semitransmission portions 130 are sufficient to partially transmit the irradiated light, and the amount of light transmission by the light semitransmission portions 130 is not limited. Preferably, the light semitransmission portions 130 transmit 10%~90% of the irradiated light.

Figure 3A:
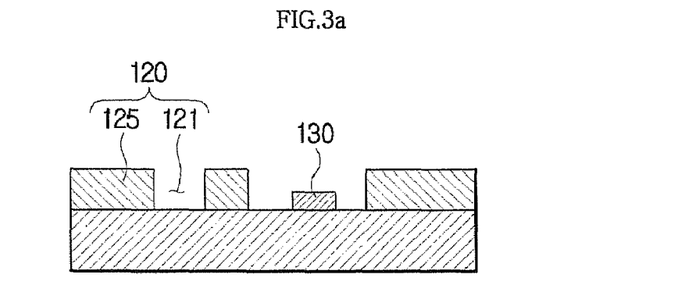
FIGS. 3A and 3B are sectional views illustrating various shapes of a light semitransmission layer of the half tone mask in accordance with the embodiment of the present invention.
Figure 3B:
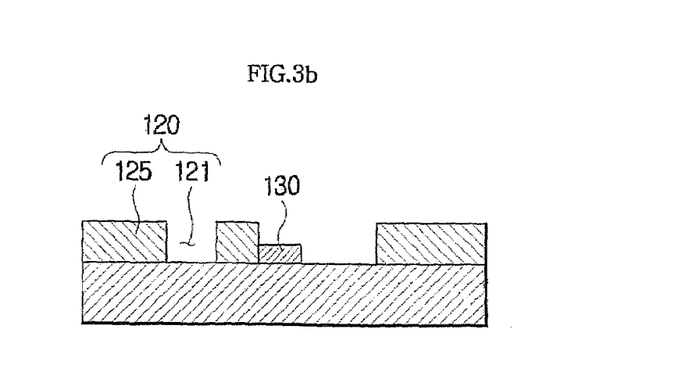

The light semitransmission portions 130 may not contact the light shield portions 125, as shown in FIG. 3A, and may contact one side of each of the light shield portions 125, as shown in FIG. 3B.

Figure 4A:
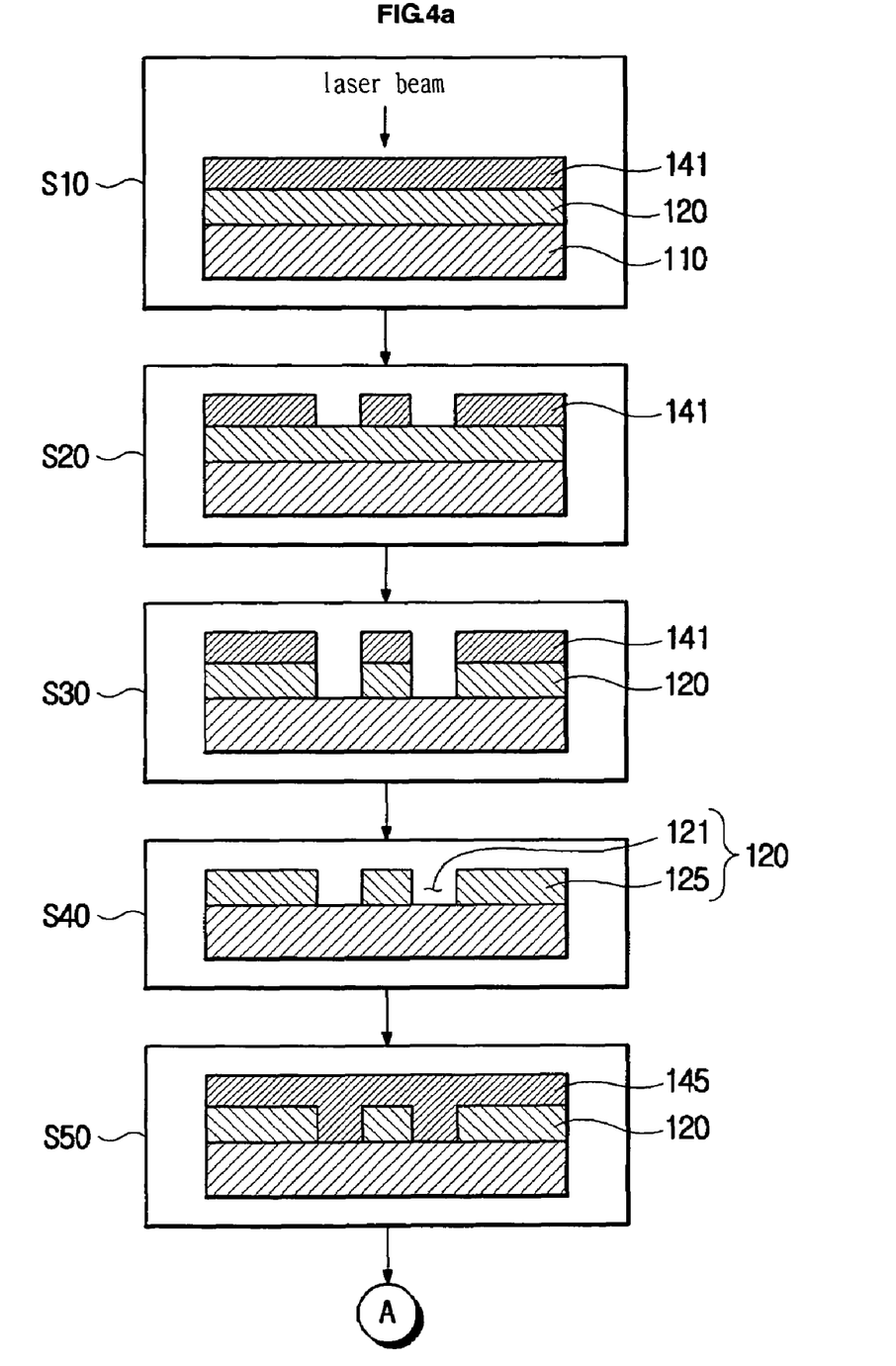
FIGS. 4A and 4b are sectional views illustrating a process for fabricating a half tone mask in accordance with a first embodiment of the present invention.
Figure 4B:
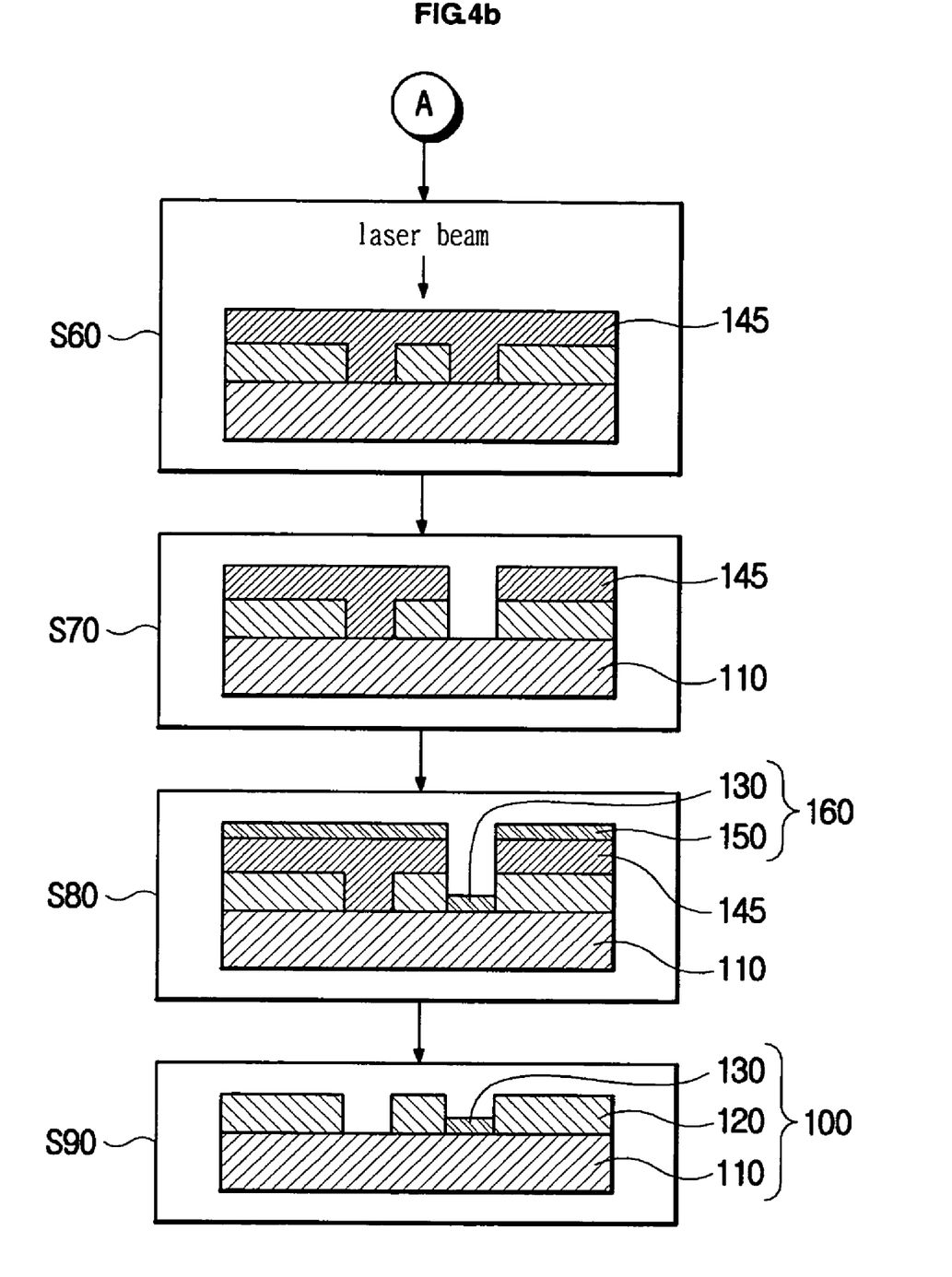

Hereinafter, with reference to FIGS. 4A and 4B, a process for fabricating the half tone mask in accordance with the above embodiment of the present invention will be described. FIGS. 4A and 4b are sectional views illustrating the process for fabricating the half tone mask in accordance with the first embodiment of the present invention.

As shown in FIGS. 4A and 4B, in step S10, the light shield layer 120 made of Cr or $CrO_2$ and a positive-type first photoresist 141 are sequentially formed on the transparent substrate 110 made of quartz, and a laser beam is irradiated downwardly onto the first photoresist 141, thereby drawing a desired pattern through onto the first photoresist 141. Preferably, alignment marks are formed at corners of the light shield layer 120.

In step S20, portions of the first photoresist 141, onto which the laser beam is irradiated, are removed by development. In step S30, portions of the light shield layer 120, which are exposed to the outside by removing the first photoresist 141, are removed by etching.

In step S40, the photoresist 141 is completely removed. Then, portions of the transparent substrate 110, from which the light shield layer 120 is removed, serve as the light transmission portions 121 for completely transmitting light in a designated wavelength range, and portions of the transparent substrate 110, at which the light shield layer 120 remains, serve as the light shield portions 125 for completely shielding light. That is, the light transmission portions 121 for transmitting light and the light shield portions 125 for shielding light are formed by the photolithography process of the light shield layer 120.

Thereafter, the light semitransmission portions 130 for partially transmitting irradiated light in a designated wavelength range are formed. Now, the formation of the light semitransmission portions 130 will be described in detail.

In step S50, a positive-type second photoresist 145 is coated on the light transmission portions 121 and the light shield portions 125. In step S60, a laser beam is irradiated onto the second photoresist 145 so that the second photoresist 145 is exposed to the laser beam, thereby drawing a desired pattern formed onto the second photoresist 145 corresponding to the light semitransmission portions 130 to be formed. In step S70, portions of the second photoresist 145, onto which the laser beam is irradiated, are removed by development. Thereby, portions of the transparent substrate 110 are exposed to the outside. The light semitransmission portions 130 are formed on the exposed portions of the transparent substrate 110.

In order to correctly draw a pattern on the coated second photoresist 145 corresponding to the light semitransmission portions 130 using the laser beam, preferably, a step of correcting the irradiation position of the laser beam onto the second photoresist 145 using the alignment marks formed at the corners of the light shield layer 120 is performed prior to the exposure and development of the second photoresist 145.

Thereafter, in step S80, a light semitransmission layer 160 made of a chemical composite, which partially transmits the irradiated light in a designated wavelength range, is coated on the second photoresist 145 and the exposed portions of the transparent substrate 110 to a designated thickness by sputtering. In step S90, the second photoresist 145 is removed. Then, the light semitransmission layer 150, made of the chemical composite partially transmitting the irradiated light, on the second photoresist 145 is removed simultaneously with the removal of the second photoresist 145.

Then, the semitransmission layer 160 made of the chemical composite is coated on only necessary parts of the light transmission portions 121 of the light shield layer 120, thereby forming the light semitransmission portions 130 partially transmitting the irradiated light in the designated wavelength range. The light transmittance of the light semitransmission portions 130 are desirably controlled by the composition and thickness of the chemical composite of the semitransmission layer 160, and the shapes of the light semitransmission portions 130 are variously modified according to the shape of a pattern to be formed.

The light semitransmission portions 130 may be made of various chemical composites so long as the composites can partially transmit irradiated light in a designated wavelength range. In the present invention, the light semitransmission portions 130 are made of one selected from the group consisting of $Cr_xO_y$, $Cr_xCo_y$, $Cr_xCo_yN_z$, $Si_xN_y$, and $Mo_xSi_y$. Most preferably, the light semitransmission portions 130 are made of $Cr_xO_y$. Here, subscripts x, y, and z are natural numbers and denote the numbers of respective chemical elements.

The wavelength range of the irradiated light is varied according to an exposure system, thus being not restricted. Generally, light in a wavelength range of 300 nm~400 nm is used. The light semitransmission portions 130 are sufficient to partially transmit the irradiated light, and the amount of light transmission by the light semitransmission portions 130 is not limited. Preferably, the light semitransmission portions 130 transmit 10%~90% of the irradiated light.

Figure 5A:
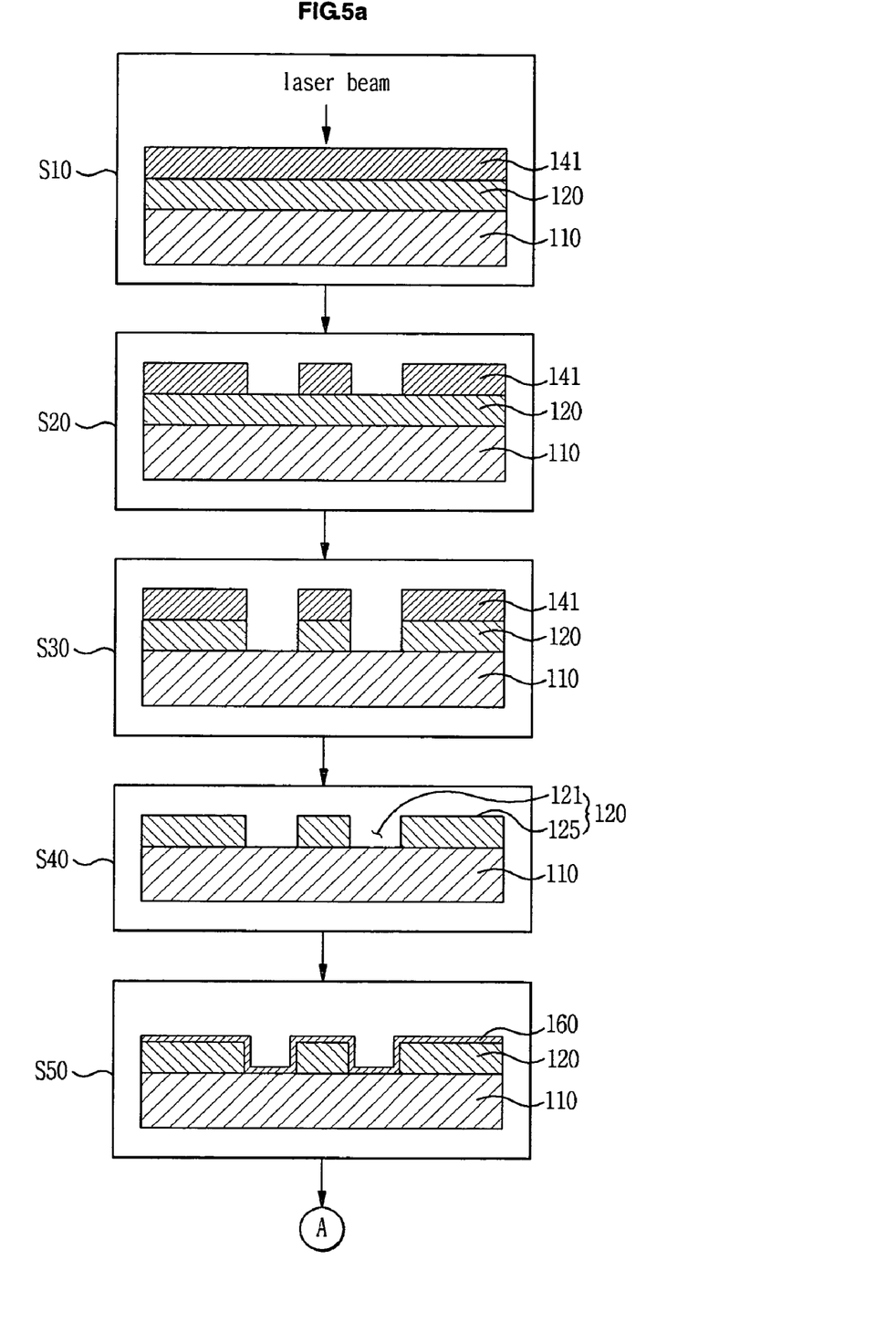
FIGS. 5A and 5B are sectional views illustrating a process for fabricating a half tone mask in accordance with a second embodiment of the present invention.
Figure 5B:
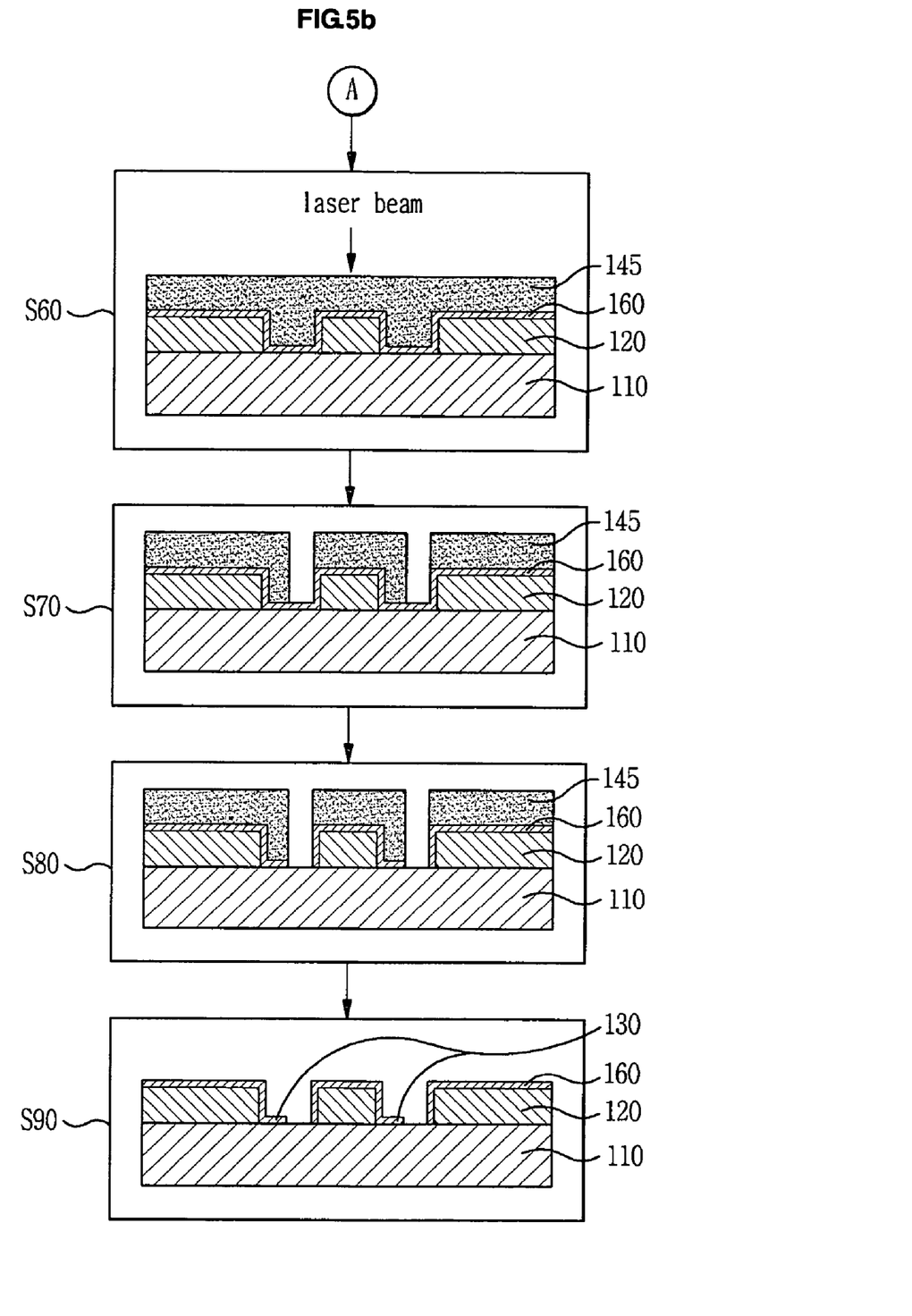

Hereinafter, with reference to FIGS. 5A and 5B, a process for fabricating a half tone mask in accordance with a second embodiment of the present invention will be described. FIGS. 5A and 5B are sectional views illustrating the process for fabricating the half tone mask in accordance with the second embodiment of the present invention.

As shown in FIGS. 5A and 5B, in step S10, the light shield layer 120 made of Cr or CrO2 and the positive-type first photoresist 141 are sequentially formed on the transparent substrate 110 made of quartz, and a laser beam is irradiated onto the first photoresist 141, thereby drawing a desired pattern onto the first photoresist 141. Preferably, alignment marks are formed at corners of the light shield layer 120.

In step S20, portions of the first photoresist 141, onto which the laser beam is irradiated, are removed by development. In step S30, portions of the light shield layer 120, which are exposed to the outside by removing the first photoresist 141, are removed by etching.

In step S40, the photoresist 141 is completely removed. Then, portions of the transparent substrate 110, from which the light shield layer 120 is removed, serve as the light transmission portions 121 for completely transmitting light in a designated wavelength range, and portions of the transparent substrate 110, at which the light shield layer 120 remains, serve as the light shield portions 125 for completely shielding the light. That is, the light transmission portions 121 for transmitting light and the light shield portions 125 for shielding light are formed by the photolithography process of the light shield layer 120.

Thereafter, the light semitransmission portions 130 for partially transmitting the irradiated light in a designated wavelength range are formed. Now, the formation of the light semitransmission portions 130 will be described in detail.

In step S50, the light semitransmission layer 160 for partially transmitting light in a designated wavelength range is formed on the light transmission portions 121 and the light shield portions 125. The light semitransmission layer 160 is coated on the light transmission portions 121 and the light shield portions 125 by sputtering covering a top portion and lateral portions of the light shield layer 120. The light semitransmission layer 160 is made of a chemical composite, which partially transmits the irradiated light in the designated wavelength range. The above formation of the light semitransmission layer 160 in the second embodiment differs from the formation of the light semitransmission layer in the first embodiment in that the light semitransmission layer 160 of the first embodiment is formed on the photoresist and the transparent substrate.

After the formation of the light semitransmission layer 160, the positive-type second photoresist 145 is coated on the light semitransmission layer 160 (with reference to step S60). In step S60, a laser beam is irradiated onto the second photoresist 145, thereby drawing a desired pattern onto the second photoresist 145 so that necessary portions of the light semitransmission layer 160 are exposed to the outside. In step S70, portions of the second photoresist 145, onto which the laser beam is irradiated, are removed by development.

In order to correctly draw a pattern on the coated second photoresist 145 using the laser beam after the coating of the second photoresist 145, preferably, a step of correcting the irradiation position of the laser beam onto the second photoresist 145 using the alignment marks formed at the corners of the light shield layer 120 is performed prior to the exposure and development of the second photoresist 145.

Thereafter, in step S80, the exposed portions of the light semitransmission layer 160 are removed by wet etching so that designated portions of the transparent substrate 110 are exposed to the outside. In step S90, the second photoresist 145 remaining on the light semitransmission layer 160 is removed. Then, the light semitransmission layer 160 remains on the light shield portions 125 and parts of the transparent substrate 110, and the portions of the light semitransmission layer 160 remaining on the parts of the transparent substrate 110 correspond to the light semitransmission portions 130.

That is, a chemical composite, which partially transmits irradiated light in a designated wavelength range, is coated on necessary parts of the light transmission portions 121 of the light shield layer 120, thereby forming the light semitransmission portions 130 for partially transmitting the irradiated light in the designated wavelength range. The light transmittance of the light semitransmission portions 130 are desirably controlled by the composition and thickness of the chemical composite, and the shapes of the light semitransmission portions 130 are variously modified according to the shape of a pattern to be formed.

The light semitransmission portions 130 or the light semitransmission layer 160 may be made of various chemical composites so long as the composites can partially transmit irradiated light in a designated wavelength range. In the present invention, the light semitransmission portions 130 are made of one selected from the group consisting of $Cr_xO_y$, $Cr_xCo_y$, $Cr_xCo_yN_z$, $Si_xN_y$, and $Mo_xSi_y$. Most preferably, the light semitransmission portions 130 are made of $Cr_xO_y$. Here, subscripts x, y, and z are natural numbers and denote the numbers of respective chemical elements.

The wavelength range of the irradiated light is varied according to an exposure system, thus being not restricted. Generally, light in a wavelength range of 300 nm~400 nm is used. The light semitransmission portions 130 are sufficient to partially transmit the irradiated light, and the amount of light transmission by the light semitransmission portions 130 is not limited. Preferably, the light semitransmission portions 130 transmit 10%~90% of the irradiated light.

Figure 6A:
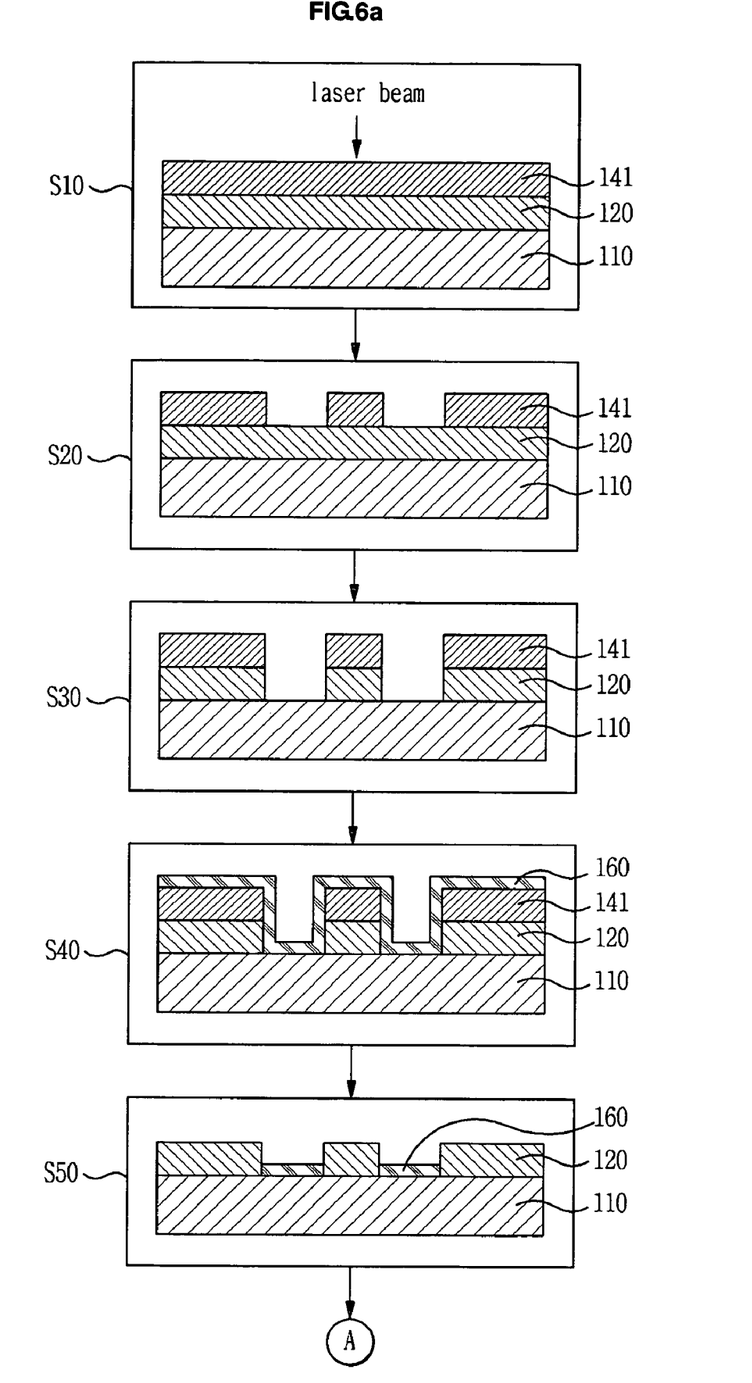
FIGS. 6A and 6B are sectional views illustrating a process for fabricating a half tone mask in accordance with a third embodiment of the present invention.
Figure 6B:
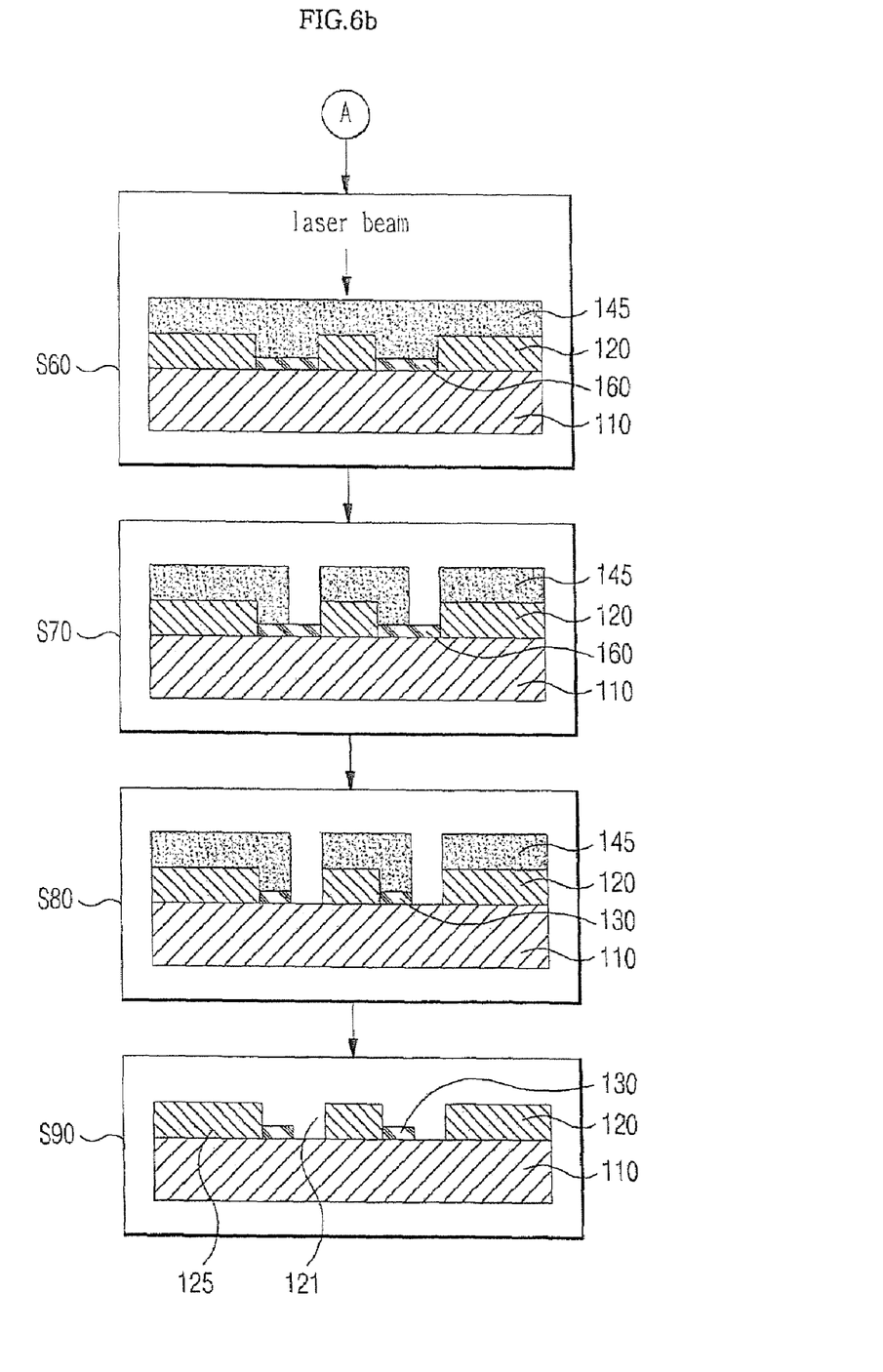

Hereinafter, with reference to FIGS. 6A and 6B, a process for fabricating a half tone mask in accordance with a third embodiment of the present invention will be described. FIGS. 6A and 6B are sectional views illustrating the process for fabricating the half tone mask in accordance with the third embodiment of the present invention.

As shown in FIGS. 6A and 6B, in step 510, the light shield layer 120 made of Cr or CrO2 and the positive-type first photoresist 141 are sequentially formed on the transparent substrate 110 made of quartz, and a laser beam is irradiated onto the first photoresist 141, thereby drawing a desired pattern onto the first photoresist 141. Preferably, alignment marks are formed at corners of the light shield layer 120.

In step S20, portions of the first photoresist 141, onto which the laser beam is irradiated, are removed by development. In step S30, portions of the light shield layer 120, which are exposed to the outside by removing the first photoresist 141, are removed by etching. Thereby, light transmission portions, in which the transparent substrate 110 is exposed to the outside, and light shield portions, in which the first photoresist 141 remains, are formed. That is, the light transmission portions 121 for transmitting light and the light shield portions 125 for shielding light are formed by the photolithography process of the light shield layer 120.

In step S40, the light semitransmission layer 160 for partially transmitting irradiated light in a designated wavelength range is formed on the remaining first photoresist 141 and the exposed light transmission portions 121. The above formation of the light semitransmission layer 160 in the third embodiment differs from the formation of the light semitransmission layer in the second embodiment in that the light semitransmission layer of the second embodiment is formed after the remaining first photoresist is removed.

The light semitransmission layer 160 is coated on the remaining first photoresist 141 and the exposed light transmission portions 121 by sputtering. The light semitransmission layer 160 is made of a chemical composite, which partially transmits the irradiated light in the designated wavelength range.

In step S50, the remaining first photoresist 141 and the light semitransmission layer 160 formed on the remaining first photoresist 141 are removed. Thereby, the light shield portions are exposed to the outside, and the light semitransmission layer 160 remains on the light transmission portions.

After the light semitransmission layer 160 remains on the light transmission portions, the positive-type second photoresist 145 is coated on the remaining light semitransmission layer 160 and the light shield portions (with reference to step S60). In step S60, a laser beam is irradiated onto the second photoresist 145, thereby drawing a desired pattern onto the second photoresist 145 so that necessary portions of the light semitransmission layer 160 are exposed to the outside. In step S70, portions of the second photoresist 145, onto which the laser beam is irradiated, are removed by development.

In order to correctly draw a pattern on the coated second photoresist 145 using the laser beam after the coating of the second photoresist 145, preferably, a step of correcting the irradiation position of the laser beam onto the second photoresist 145 using the alignment marks formed at the corners of the light shield layer 120 is performed prior to the exposure and development of the second photoresist 145.

In step S80, designated portions of the transparent substrate 110 are exposed to the outside by wet etching the exposed portions of the remaining light semitransmission layer 160. Here, the portions of the light semitransmission layer 160, which are not removed by wet etching but finally remain, correspond to the light semitransmission portions 130.

That is, a chemical composite, which partially transmits the irradiated light in a designated wavelength range, is coated on necessary parts of the light transmission portions 121 of the light shield layer 120, thereby forming the light semitransmission portions 130 for partially transmitting the irradiated light in the designated wavelength range. The light transmittance of the light semitransmission portions 130 are desirably controlled by the composition and thickness of the chemical composite, and the shapes of the light semitransmission portions 130 are variously modified according to the shape of a pattern to be formed.

The light semitransmission portions 130 or the light semitransmission layer 160 may be made of various chemical composites so long as the composites can partially transmit irradiated light in a designated wavelength range. In the present invention, the light semitransmission portions 130 are made of one selected from the group consisting of $Cr_xO_y$, $Cr_xCo_y$, $Cr_xCo_yN_z$, $Si_xN_y$, and $Mo_xSi_y$. Most preferably, the light semitransmission portions 130 are made of $Cr_xO_y$. Here, subscripts x, y, and z are natural numbers and denote the numbers of respective chemical elements.

In step S90, the second photoresist 145, which remains on the light semitransmission portions 130 and the light shield portions, is removed. Thereby, the fabrication of the half tone mask is completed.

The wavelength range of the irradiated light is varied according to an exposure system, thus being not restricted. Generally, light in a wavelength range of 300 nm~400 nm is used. The light semitransmission portions 130 are sufficient to partially transmit the irradiated light, and the amount of light transmission by the light semitransmission portions 130 is not limited. Preferably, the light semitransmission portions 130 transmit 10%~90% of the irradiated light.

Figure 7A:
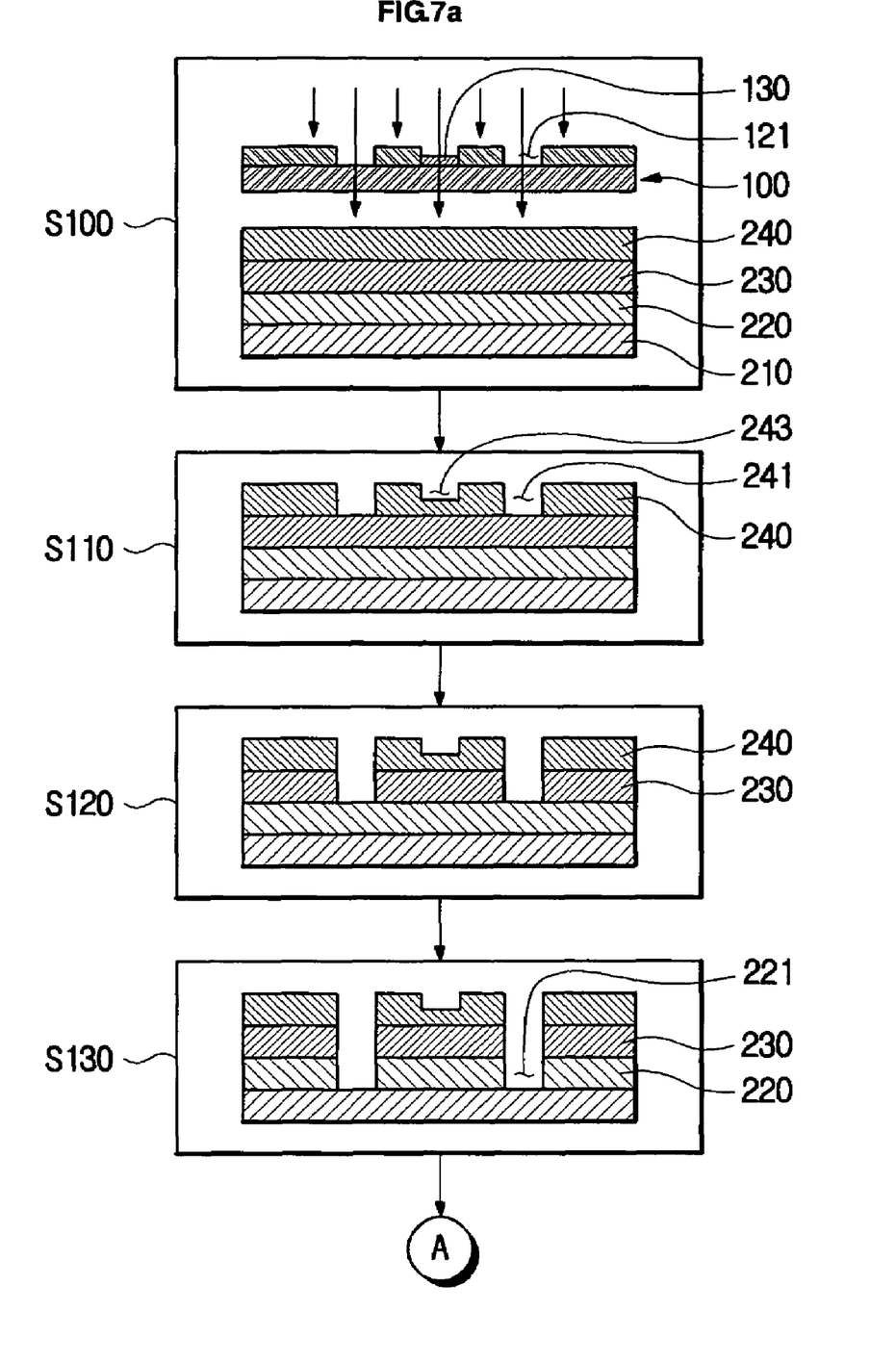
FIGS. 7A and 7B are sectional views illustrating a method for forming a pattern using a half tone mask in accordance with one embodiment of the present invention.
Figure 7B:
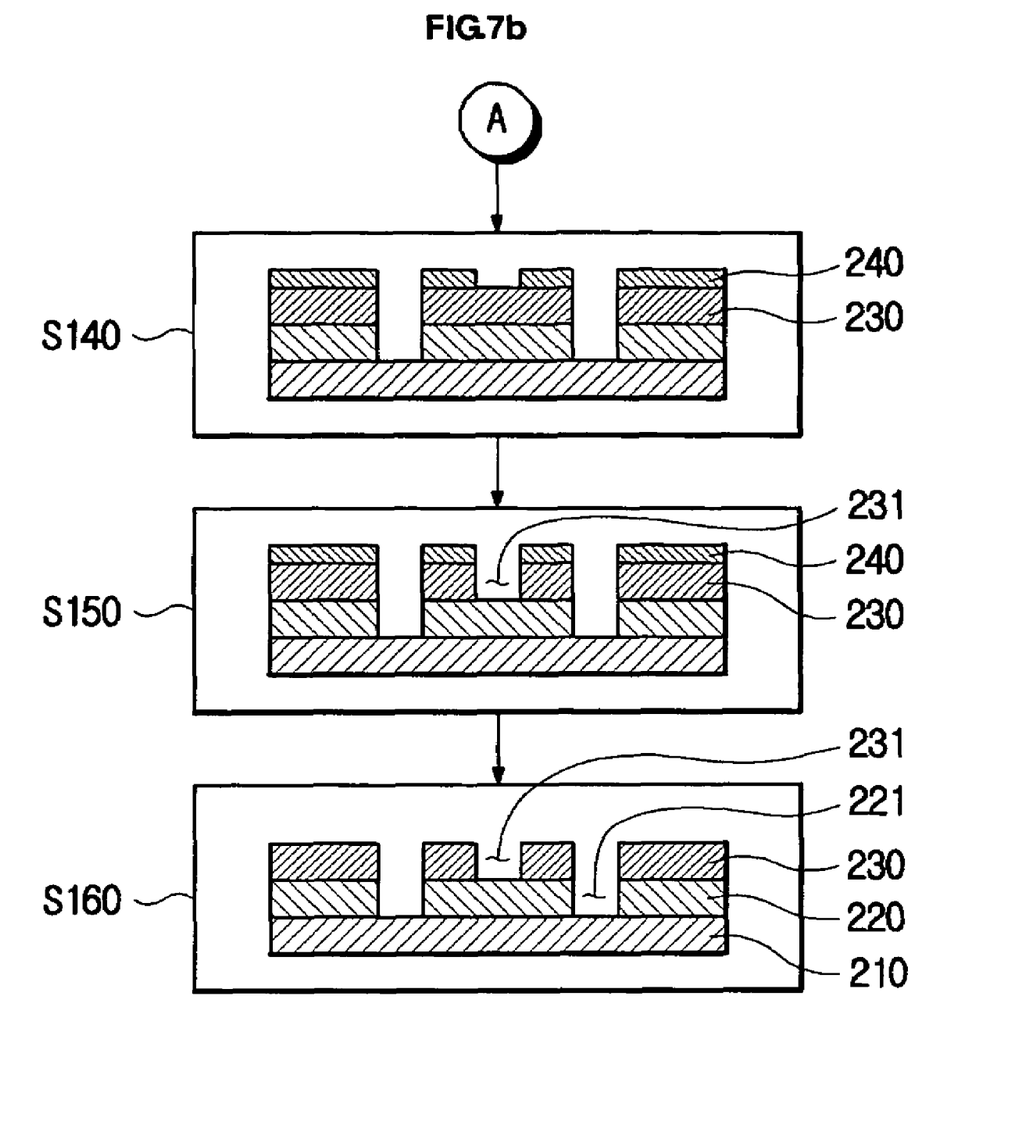

FIGS. 7A and 7B are sectional views illustrating a method for forming a pattern using a half tone mask in accordance with one embodiment of the present invention. Hereinafter, the above method will be described.

As shown in FIGS. 7A and 7B, in step S100, first and second layers 220 and 230, on which a pattern will be formed, and a photoresist 240 are sequentially formed on a glass substrate 210, a half tone mask 100 of this embodiment is placed above the photoresist 240, and light is irradiated on the half tone mask 100. In step S110, the photoresist 240 is selectively removed by first development.

Thereby, portions 241 of the photoresist 240, onto which the light is irradiated through the light transmission portions 121 of the half tone mask 100, are completely removed, and portions 243 of the photoresist 240, onto which the light is irradiated through the light semitransmission portions 130, are partially removed to a designated thickness.

Then, in step S120, portions of the second layer 230, which are exposed to the outside by the first development of the photoresist 240, are etched, and in step S130, portions of the first layer 220, which are exposed to the outside by the etching of the second layer 230, are etched. Thereby, patterns are respectively formed through the first and second layers 220 and 230.

In step S140, the remaining portions of the photoresist 240 after the first development are partially removed by ashing, which is one type of dry etching for selectively removing only an organic film by spraying gas. Then, the removed portions of the photoresist 240 by ashing have a thickness similar to that of the portions 243 of the photoresist 240, and the second layer 230 is exposed to the outside by removing the portions 243 of the photoresist 240.

Finally, in step S150, the portions of the second layer 230, which are exposed to the outside by ashing the photoresist 240, are etched, thereby forming a pattern 231. In step S160, the photoresist 240 is completely removed. Thereby, desired patterns 221 and 231 are formed through the first and second layers 220 and 230, which are sequentially formed on the glass substrate 210.

By employing the above method using the half tone mask 100 in accordance with this embodiment, it is possible to simultaneously form an active layer, a source/drain layer, a passivation layer, and a pixel layer of a TFT-LCD. Further, the above method may be applied to any process for forming several layers using a photo mask, such as a process for forming a color filter.

In the case that the half tone mask comprises multiple light semitransmission portions having different light transmittances, it is possible to manufacture a product having at least three layers using a single half tone mask.

The above-described half tone mask and method for fabricating the same are applied to manufacture various display panels. That is, the half tone mask is used to manufacture a liquid crystal display panel, and further to manufacture a flat panel display (FPD).

As apparent from the above description, the present invention provides a half tone mask, which is applied to multiple cycles of a photolithography process to shorten a time taken to fabricate the mask and reduce the production costs of the mask, a method for fabricating the same, and a flat panel display using the same.

Since a desired pattern is uniformly formed through a light semitransmission layer of the half tone mask of the present invention according to the uniformity of a chrome oxide ($Cr_xO_y$) film, i.e., the uniformity in sputtering, the half tone mask is not limited in size.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A half tone mask comprising:

a transparent substrate;

a light shield layer formed on the transparent substrate, and having light transmission portions completely transmitting irradiated light in a designated wavelength range and light shield portions completely shielding the irradiated light in the designated wavelength range; and light semitransmission portions partially transmitting the irradiated light in the designated wavelength range and made of one selected from the group consisting of $Cr_xO_y$, $Cr_xCo_y$, $Cr_xCo_yN_z$ and $Si_xN_y$, wherein x, y and z are natural numbers and denote numbers of respective chemical elements, and wherein the half tone mask is configured to simultaneously form two or more patterns in separate layers, which include: an active layer, a source/drain layer, a passivation layer, and a pixel layer of a thin film transistor (TFT) for a liquid crystal display (LCD).

2. A method for fabricating a halftone mask comprising:

sequentially forming a light shield layer and a first photoresist on a transparent substrate, and forming light transmission portions for transmitting light and light shield portions for shielding light on the light shield layer by exposure, development, and etching;

removing the first photoresist;

forming a second photoresist on the light shield portions and the light transmission portions, and exposing and developing the second photoresist to expose the required portions of the light transmission portions;

forming a light semitransmission layer for partially transmitting irradiated light in a designated wavelength range on the second photoresist and exposed portions of the transparent substrate, the light semitransmission layer made of one selected from the group consisting of $Cr_xO_y$, $Cr_xO_y$, $Cr_xCo_y$, $Cr_xCo_yN_z$ and $Si_xN_y$, wherein x, y and z are natural numbers and denote numbers of respective chemical elements; and removing the second photoresist and the light semitransmission layer formed on the second photoresist, wherein the half tone mask is configured to simultaneously form two or more patterns in separate layers, which include: an active layer, a source/drain layer, a passivation layer, and a pixel layer of a thin film transistor (TFT) for a liquid crystal display (LCD).

3. A method for fabricating a halftone mask comprising:

sequentially forming a light shield layer and a first photoresist on a transparent substrate, and forming light transmission portions for transmitting light and light shield portions for shielding light on the light shield layer by exposure, development, and etching;

removing the first photoresist;

forming a light semitransmission layer for partially transmitting irradiated light in a designated wavelength range on the light shield portions and the light transmission portions, the light semitransmission layer made of one selected from the group consisting of $Cr_xO_y$, $Cr_xCo_y$, $Cr_xCo_yN_z$ and $Si_xN_y$, wherein x, y and z are natural numbers and denote numbers of respective chemical elements;

forming a second photoresist on the light semitransmission layer, and exposing and developing the second photoresist to expose the required portions of the light semitransmission layer;

etching the exposed portions of the light semitransmission layer, and removing the second photoresist, wherein the half tone mask is configured to simultaneously form two or more patterns in separate layers, which include: an active layer, a source/drain layer, a passivation layer, and a pixel layer of a thin film transistor (TFT) for a liquid crystal display (LCD).

4. A method for fabricating a halftone mask comprising:

sequentially forming a light shield layer and a first photoresist on a transparent substrate, and forming light transmission portions for transmitting light and light shield portions for shielding light on the light shield layer by exposure, development, and etching;

forming a light semitransmission layer for partially transmitting irradiated light in a designated wavelength range on the first photoresist and the light transmission portions, the light semitransmission layer made of one selected from the group consisting of $Cr_xO_y$, $Cr_xCo_y$, $Cr_xCo_yN_z$ and $Si_xN_y$, wherein x, y and z are natural numbers and denote numbers of respective chemical elements;

exposing the light shield portions by removing the first photoresist and portions of the light semitransmission layer formed on the first photoresist;

forming a second photoresist on the light shield portions and remaining portions of the light semitransmission layer, and exposing and developing the second photoresist to expose the required portions of the light semitransmission layer; and etching the exposed portions of the light semitransmission layer, and removing the second photoresist, wherein the half tone mask is configured to simultaneously form two or more patterns in separate layers, which include: an active layer, a source/drain layer, a passivation layer, and a pixel layer of a thin film transistor (TFT) for a liquid crystal display (LCD).

5. A halftone mask comprising:

a transparent substrate;

a light shield layer formed on the transparent substrate, and having light transmission portions completely transmitting irradiated light in a designated wavelength range and light shield portions completely shielding the irradiated light in the designated wavelength range; and light semitransmission portions partially transmitting the irradiated light in the designated wavelength range and made of one selected from the group consisting of $Cr_xO_y$, $Cr_xCo_y$, $Cr_xCo_yN_z$ and $Si_xN_y$ and covering a top portion and a lateral portion of the light shield layer,
wherein x, y and z are natural numbers and denote numbers of respective chemical elements, and wherein the half tone mask is configured to simultaneously form two or more patterns in separate layers, which include: an active layer, a source/drain layer, a passivation layer, and a pixel layer of a thin film transistor (TFT) for a liquid crystal display (LCD).

* * * * *